United States Patent
Kabir et al.

(10) Patent No.: US 9,252,797 B1
(45) Date of Patent: Feb. 2, 2016

(54) RETURN-TO-ZERO DIGITAL-TO-ANALOG CONVERTER WITH OVERLAPPING TIME DELAYED PULSE GENERATION

(71) Applicant: Freescale Semiconductor, Inc., Austin, TX (US)

(72) Inventors: Mohammad Nizam Kabir, Tempe, AZ (US); Mariam Hoseini, Tempe, AZ (US); Brandt Braswell, Chandler, AZ (US); Bruce M. Newman, Gilbert, AZ (US)

(73) Assignee: FREESCALE SEMICONDUCTOR INC., Austin, TX (US)

(*) Notice: Subject to any disclaimer, the term of this patent is extended or adjusted under 35 U.S.C. 154(b) by 0 days.

(21) Appl. No.: 14/530,033

(22) Filed: Oct. 31, 2014

(51) Int. Cl.
*H03M 1/66* (2006.01)
*H03M 1/06* (2006.01)

(52) U.S. Cl.
CPC .............. *H03M 1/0626* (2013.01); *H03M 1/66* (2013.01)

(58) Field of Classification Search
CPC ............................... H03M 1/66; H03M 1/0626
USPC .......... 341/155, 144, 143, 122, 138, 118, 120
See application file for complete search history.

(56) References Cited

U.S. PATENT DOCUMENTS

| | | | | |
|---|---|---|---|---|
| 6,061,010 A * | 5/2000 | Adams | ............... | H03M 1/0863 341/144 |
| 6,977,602 B1 | 12/2005 | Ostrem et al. | | |
| 7,312,737 B2 * | 12/2007 | Jungerman | ........... | H03M 1/662 341/141 |
| 7,391,251 B1 * | 6/2008 | Zhang | .................... | H03K 5/159 327/261 |
| 7,576,675 B1 * | 8/2009 | Lee | ..................... | H03M 1/0818 341/144 |
| 7,880,654 B2 | 2/2011 | Oliaei et al. | | |
| 8,031,098 B1 | 10/2011 | Ebner et al. | | |
| 9,001,925 B1 * | 4/2015 | Christensen | ....... | H04B 10/5162 375/295 |

FOREIGN PATENT DOCUMENTS

WO 2010098918 A2 9/2010

* cited by examiner

*Primary Examiner* — Peguy Jean Pierre
(74) *Attorney, Agent, or Firm* — Ingrassia Fisher & Lorenz, P.C.

(57) ABSTRACT

The embodiments described herein provide a digital-to-analog converter (DAC). The DAC implements a stepped return-to-zero (RZ) pulse scheme, where the DAC output includes the superposition of multiple time-offset RZ pulses. In one embodiment, the DAC includes a first switching element, a second switching element, a current source, and a current sink. The first switching element generates first RZ pulses, and the second switching element generates second RZ pulses, where the second RZ pulses are time-offset from the first RZ pulses. The first RZ pulses and second RZ pulses are combined to provide stepped RZ pulse output signal.

20 Claims, 6 Drawing Sheets

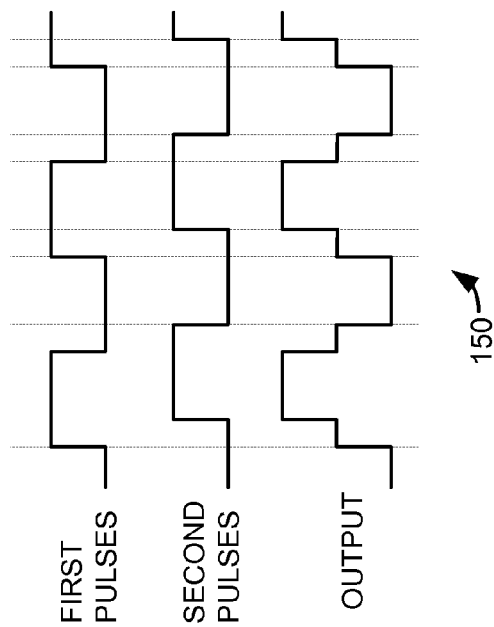
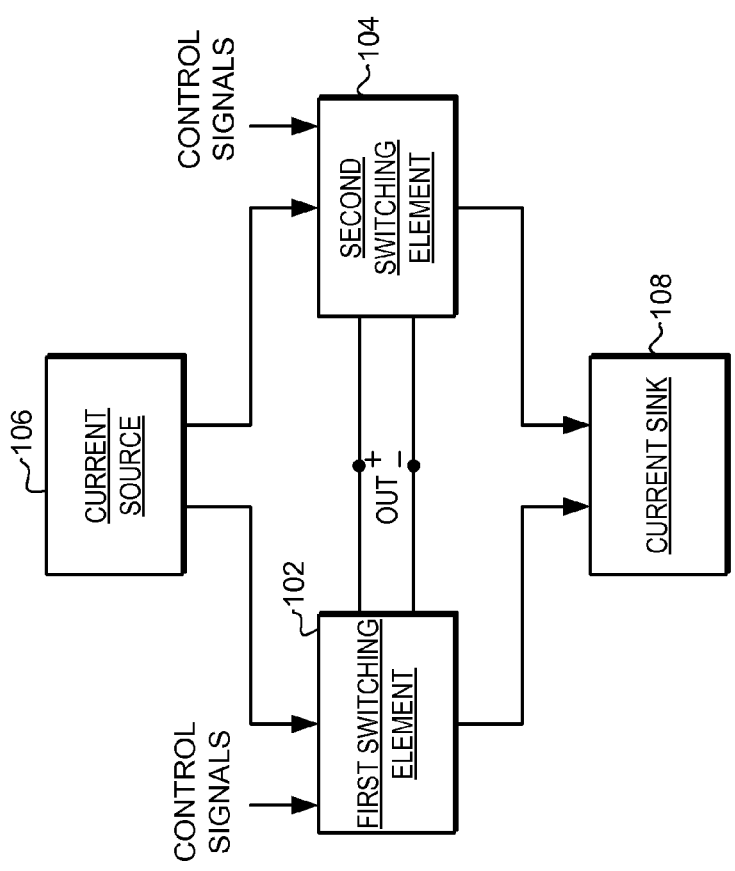
FIG. 1B
FIG. 1A

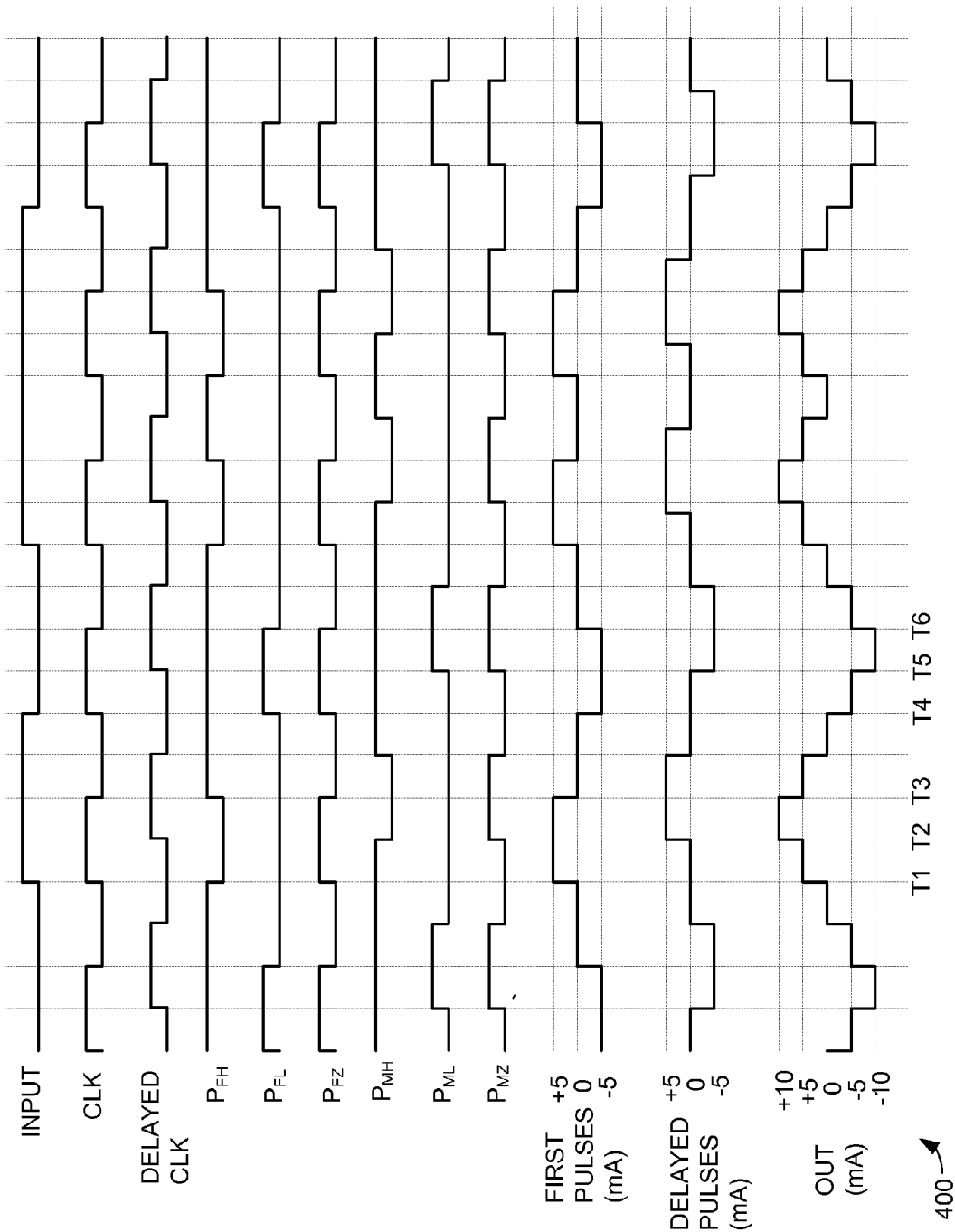

RETURN-TO-ZERO DIGITAL-TO-ANALOG CONVERTER WITH OVERLAPPING TIME DELAYED PULSE GENERATION

TECHNICAL FIELD

Embodiments relate generally to mixed-signal circuits, and more particularly, embodiments of the subject matter relate to digital-to-analog converters (DACs).

BACKGROUND

In many modern electronics applications, it is desirable to convert a digital value to an analog signal. For example, digital-to-analog converters (DACs) are commonly used in the feedback path of analog-to-digital converters (ADCs). In some ADCs, sigma-delta modulation (or alternatively, delta-sigma modulation) is used to reduce the effect of quantization error and improve signal-to-noise ratio (SNR).

Some ADCs utilize continuous-time sigma-delta modulators, that is, sigma-delta modulators constructed using continuous-time circuitry. Continuous-time sigma-delta modulators can be clocked at higher sampling frequencies which improves the performance of the sigma-delta ADC.

In practice, however, a high-speed sigma-delta ADC can be limited in performance by the DACs in the feedback path. For example, some sigma-delta ADCs utilize a DAC in the feedback path that uses a return-to-zero (RZ) pulse scheme. Other sigma-delta ADCs utilize a DAC in the feedback path that uses a non-return-to-zero (NRZ) pulse scheme.

In general, a DAC using an RZ pulse scheme can provide better immunity to inter-symbol interference compared to a DAC using a NRZ pulse scheme. However, a DAC using an RZ pulse scheme is more susceptible to the effects of clock jitter than DAC using a NRZ pulse scheme. Furthermore, a DAC using an RZ pulse scheme can have increased slew rate requirements compared to a DAC using a NRZ pulse scheme. For these reasons there continues to be a need for DACs that can be used in ADCs while providing relatively good immunity to clock jitter, inter-symbol interference, and while having reduced slew rate requirements.

BRIEF DESCRIPTION OF THE DRAWINGS

FIG. 1A is a schematic diagram of a DAC in accordance with an exemplary embodiment;

FIG. 1B is a timing diagram in accordance with an exemplary embodiment;

FIG. 4 is a timing diagram in accordance with an exemplary embodiment; and

DETAILED DESCRIPTION

Figure 1D:
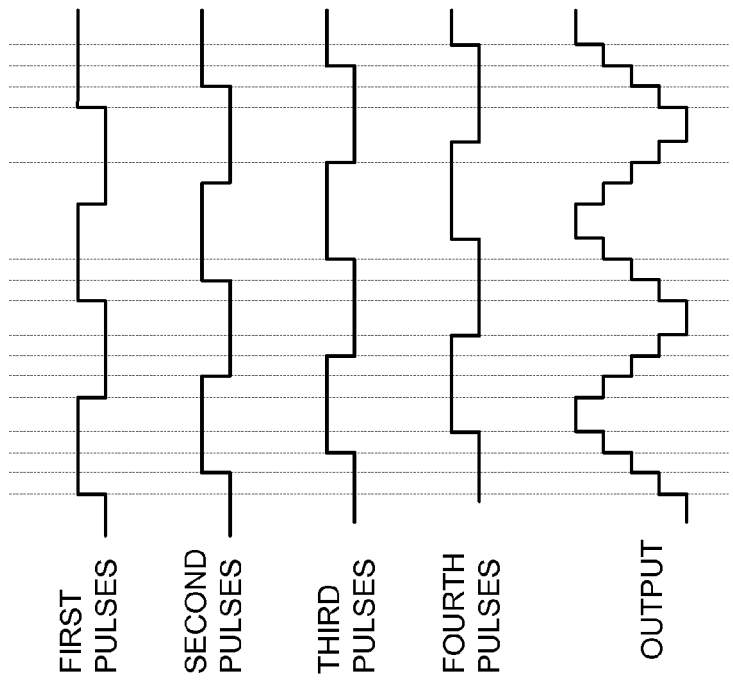
FIG. 1D is a timing diagram in accordance with another exemplary embodiment.

The embodiments described herein provide a digital-to-analog converter (DAC) that can provide improved performance. Specifically, the embodiments provide a DAC that can have both relatively good immunity to clock jitter and a relatively low slew rate requirement over traditional return-to-zero (RZ) architectures, while still providing relatively good immunity to inter-symbol interference (ISI). As such, the DAC can be used in a variety of high performance applications. As one specific example, the DAC can be used in the feedback path of analog-to-digital converters (ADCs) that utilize continuous-time sigma-delta modulation.

In general, the DACs described herein use a stepped RZ pulse scheme, where the output includes the superposition of multiple time-offset RZ pulses. This stepped RZ pulse scheme can provide both relatively good immunity to clock jitter and relatively good immunity to inter-symbol interference over traditional structures, while still satisfying relatively low slew rate requirements.

Turning now to FIG. 1A, schematic diagram of a DAC element 100 in accordance with an exemplary embodiment is illustrated. The DAC element 100 includes a first switching element 102, a second switching element 104, a current source 106, and a current sink 108. In general, the DAC element 100 is configured to receive control signals and generate an output having a stepped RZ pulse scheme, with the average output being proportional to a digital input signal.

Specifically, the first switching element 102 is configured to generate a first RZ pulse in response to the control signals. Likewise, the second switching element 104 is configured to generate a second RZ pulse in response to the control signals, where the second RZ pulse is delayed in time from and partially overlaps with the first RZ pulse. The first switching element 102 and the second switching element 104 are coupled to the output (OUT) of the DAC element 100, such that the output is configured to combine the first RZ pulse and the second RZ pulse to generate a combined pulse that is proportional to a digital input signal. Turning to FIG. 1B, a timing diagram 150 illustrates exemplary first RZ pulses, second RZ pulses, and an exemplary combined output of the DAC element 100. As can be seen in FIG. 1B, the second RZ pulses are delayed compared to the first RZ pulses, and the combined output is a superposition of the first RZ pulses and the second RZ pulses. As will be explained in greater detail below, such combined pulses effectively provide a stepped RZ pulse scheme that can provide both relatively good immunity to clock jitter and relatively good immunity to inter-symbol interference over traditional structures, while also satisfying a relatively reduced slew rate requirement.

Returning to FIG. 1A, the current source 106 is configured provide matched currents to the first switching element 102 and the second switching element 104. Likewise, the current sink 108 is configured to sink matched currents from the first switching element 102 and the second switching element 104. The current source 106 and current sink 108 thus provide the current used to generate the combined pulses at the output of the DAC element 100. The use of the same current sources and sinks for both the first switching element 102 and the second switching element 104 provides a better statistical match for setting the gain of the DAC element 100.

As described above, the second RZ pulses are delayed in time from and partially overlap with the first RZ pulses. To partially overlap the first RZ pulses, the second RZ pulses should be delayed at least a non-zero amount and less than a T/2 amount, where T is the period of the clock used to generate the first and second RZ pulses. In specific embodiments the second RZ pulses would be delayed between T/8 and 3T/8, and in one embodiment a delay of T/4 can be used.

In some embodiments, additional switching elements can be used to provide additional delayed RZ pulses. In such embodiments the additional switching elements can be integrated into the DAC element 100. For example, the additional switching elements can be coupled to the current source 106 and current sink 108 to provide balanced current to the additional switching elements. Likewise, the additional switching elements can be coupled to receive control signals and provide the additional delayed RZ pulses to the combined output.

For example, a third switching element can be added to the DAC element 100, where the third switching element is configured to generate third RZ pulses in response to the control signal. In this embodiment, the third RZ pulses can be delayed in time and partially overlapping with the both the first RZ pulses and the second RZ pulses. As one specific example, the second RZ pulses can be delayed an amount of T/6, and the third RZ pulses can be delayed an amount of T/3, where again T is the clock period used to generate the RZ pulses. In such an embodiment the combined output would comprise a combination of all three RZ pulses.

Figure 1C:
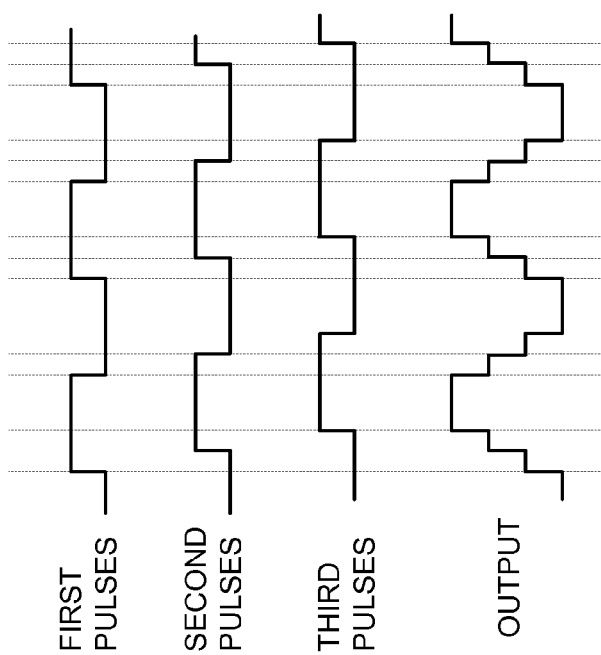
FIG. 1C is a timing diagram in accordance with another exemplary embodiment.

Turning to FIG. 1C, a timing diagram 170 illustrates exemplary first RZ pulses, second RZ pulses, third RZ pulses, and an exemplary combined output. As can be seen in FIG. 1C, the second RZ pulses and third RZ pulses are delayed compared to the first RZ pulses, and the combined output is a superposition of the first RZ pulses, second RZ pulses and third RZ pulses.

As an additional example, a fourth switching element can be added to the DAC element 100, where the fourth switching element is configured to generate fourth RZ pulses in response to the control signal. In this embodiment, the fourth RZ pulses can be delayed in time and partially overlapping with the first RZ pulses, the second RZ pulses, and the third RZ pulses. As one specific example, the second RZ pulses can be delayed an amount of T/8, the third RZ pulses can be delayed an amount of T/4, and the fourth RZ pulses can be delayed an amount of 3T/8, where again T is the clock period used to generate the RZ pulses. In such an embodiment the combined output would comprise a combination of all four RZ pulses. And it should be noted that such embodiments could be further expanded with the addition of additional switching elements configured to provide more delayed RZ pulses.

Turning to FIG. 1D, a timing diagram 190 illustrates exemplary first RZ pulses, second RZ pulses, third RZ pulses, fourth RZ pulses, and an exemplary combined output. As can be seen in FIG. 1D, the second RZ pulses, third RZ pulses and fourth RZ pulses are delayed compared to the first RZ pulses, and the combined output is a superposition of the first RZ pulses, second RZ pulses, third RZ pulses and fourth RZ pulses.

Figure 2:
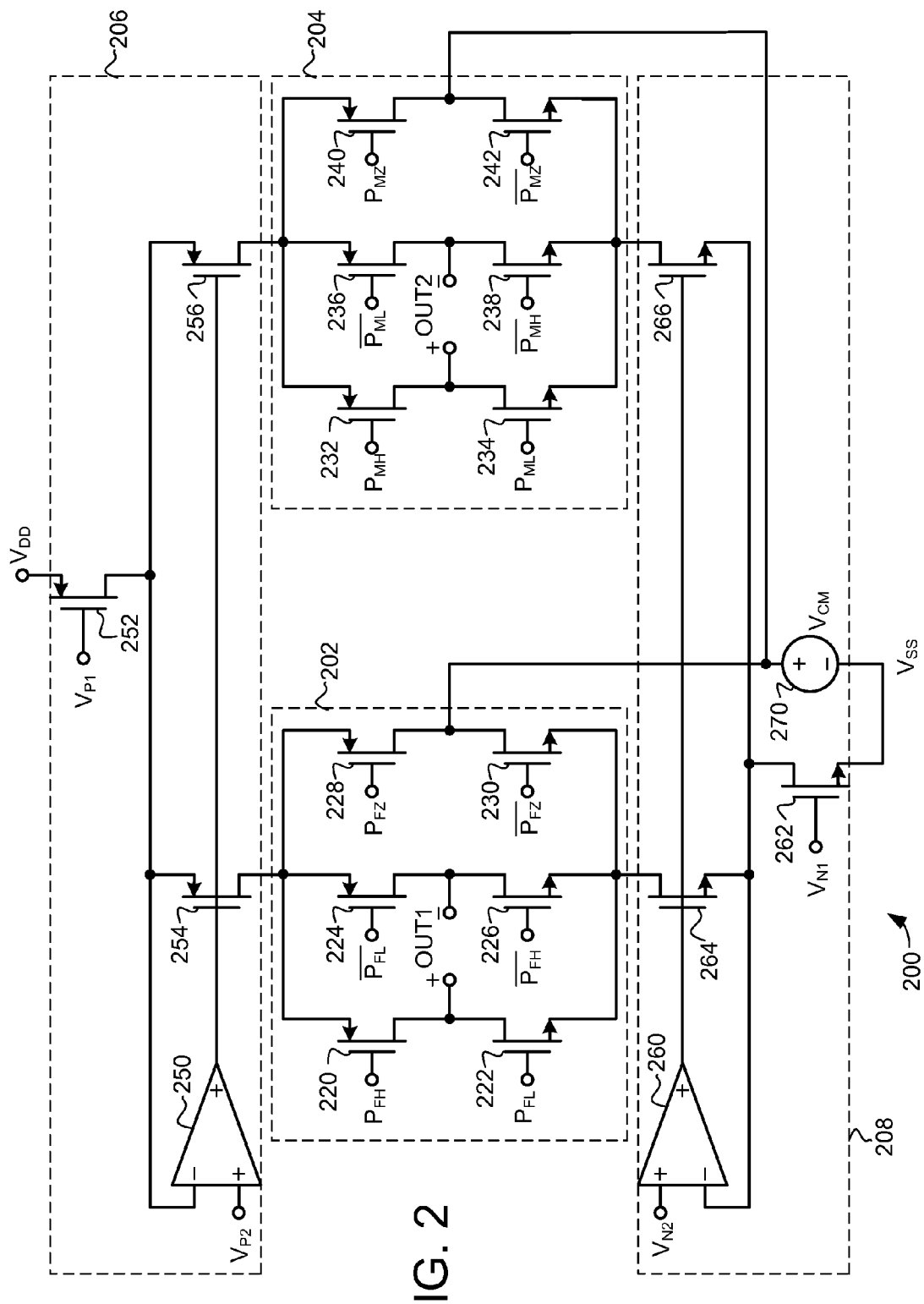
FIG. 2 is a circuit diagram of a DAC in accordance with another exemplary embodiment.

Turning now to FIG. 2, a circuit diagram of a DAC element 200 in accordance with a more specific exemplary embodiment is illustrated. In general, the DAC element 200 includes a first switching element 202, a second switching element 204, a current source 206, and a current sink 208. The DAC element 200 has outputs OUT1 and OUT2, where those outputs are coupled together (coupling not shown in FIG. 2) to provide a combined output that will have a stepped RZ pulse scheme. The current source 206 is coupled to a positive voltage $V_{DD}$, and the current sink 208 is coupled to a negative voltage $V_{SS}$. Bias voltages $V_{P1}$ and $V_{P2}$ control the operation of the current source 206. Specifically, bias voltage $V_{P1}$ determines the overall supply current flowing through transistor 252. That overall supply current is split, with balanced and equal currents flowing through transistors 254 and 256. Specifically, the bias voltage $V_{P2}$ drives amplifier 250, which uses negative feedback to control transistors 254 and 256 and provide a balanced and equal current to the switching elements 202 and 204. Likewise, bias voltages $V_{N1}$ and $V_{N2}$ control the operation of the current sink 208. Specifically, bias voltage $V_{N1}$ determines the overall current flowing through transistor 262. That overall sink current is split, with balanced and equal currents flowing through transistors 264 and 266. Specifically, the bias voltage $V_{N2}$ drives amplifier 260, which uses negative feedback to control transistors 264 and 266 and sink balanced and equal current from the switching elements 202 and 204.

The DAC element 200 is further configured to receive control signals (i.e., $P_{FH}$, $P_{FL}$, $P_{FZ}$, $P_{MH}$, $P_{ML}$, $P_{MZ}$, and their inverses) and generate an output being proportional to a digital input signal. Specifically, the output at OUT1 and OUT2 is combined into a stepped RZ pulse stream that, when integrated over time, provides an analog signal that is representative of the digital input signal. The first switching element 202 includes transistors 220, 222, 224, 226, 228, and 230. These transistors are coupled to the control signals $P_{FH}$, $P_{FL}$, $P_{FZ}$ and their inverses. Likewise, the second switching element 204 includes transistors 232, 234, 236, 238, 240 and 242. These transistors are likewise coupled to the control signals $P_{MH}$, $P_{ML}$, $P_{MZ}$ and their inverses. The current source 206 includes amplifier 250 and transistors 252, 254 and 256. The current sink 208 includes amplifier 260 and transistors 262, 264 and 266.

During operation, the control signals $P_{FH}$, $P_{FL}$, $P_{FZ}$ and their inverses are used to generate first RZ pulses. Specifically, when $P_{FH}$ and $P_{FL}$ are low, and $P_{FZ}$ is high, the transistors 220 and 226 are on, and transistors 222, 224, 228, and 230 are off. This generates a positive current at OUT1. Conversely when $P_{FH}$, $P_{FL}$ and $P_{FZ}$ are high, the transistors 222 and 224 are on, and transistors 220, 226, 228, and 230 are off. This generates a negative current and at OUT1. Finally when $P_{FH}$ is high, and $P_{FL}$ and $P_{FZ}$ are low, the transistors 228 and 230 are on, and transistors 220, 222, 224, and 226 are off. This generates a zero current at OUT1.

The control signals $P_{MH}$, $P_{ML}$, $P_{MZ}$ and their inverses are likewise used to generate second RZ pulses. Specifically, when $P_{MH}$ and $P_{ML}$ are low, and $P_{MZ}$ is high, the transistors 232 and 238 are on, and transistors 234, 236, 240, and 242 are off. This generates a positive current at OUT2. Conversely when $P_{MH}$, $P_{ML}$ and $P_{MZ}$ are high, the transistors 234 and 236 are on, and transistors 232, 234, 240, and 242 are off. This generates a negative current at OUT2. Finally, when $P_{MH}$ is high, and $P_{ML}$ and $P_{MZ}$ are low, the transistors 240 and 242 are on, and transistors 232, 234, 236, and 238 are off. This generates a zero current at OUT2.

Thus, by the selective application of the control signals the first and second RZ pulses can be generated. Furthermore, these first and second RZ pulses can be generated to be partially overlapping, and the outputs OUT1 and OUT2 combined together to generate a DAC output that utilizes a stepped RZ pulse stream.

It should be noted that in this arrangement the transistors 228 and 230 provide an alternate current path for when zero current is being provided to OUT1. This prevents the current source 206 and current sink 208 from having to switch off when zero current is being provided to OUT1. Similarly, the voltage bias 270 is coupled between transistors 228 and 230, providing a current source or sink for any difference in current flowing between transistors 228 and 230. Likewise, the transistors 240 and 242 provide an alternate current path for when zero current is being provided to OUT2, again preventing the current source 206 and current sink 208 from having to switch off. And again, the voltage bias 270 is coupled between transistors 240 and 242, providing a current source or sink for any difference in current flowing between transistors 240 and 242.

It should be noted that while the DAC element 200 includes two switching elements 202 and 204, that DAC element 200 could be expanded to include additional switching elements that would each provide additional delayed RZ pulses. For example, third and fourth switching elements implemented similar to switching elements 202 and 204 could be added. In such embodiments the additional switching elements can be coupled to receive current from the current source 206 and current sink 208. Again, such an arrangement can provide balanced and equal current to each of the switching elements. The outputs of such additional switching elements can be coupled to the combined output, and such an arrangement can provide stepped RZ pulse streams such as those illustrated in FIGS. 1C and 1D.

Figures 3A, 3B:
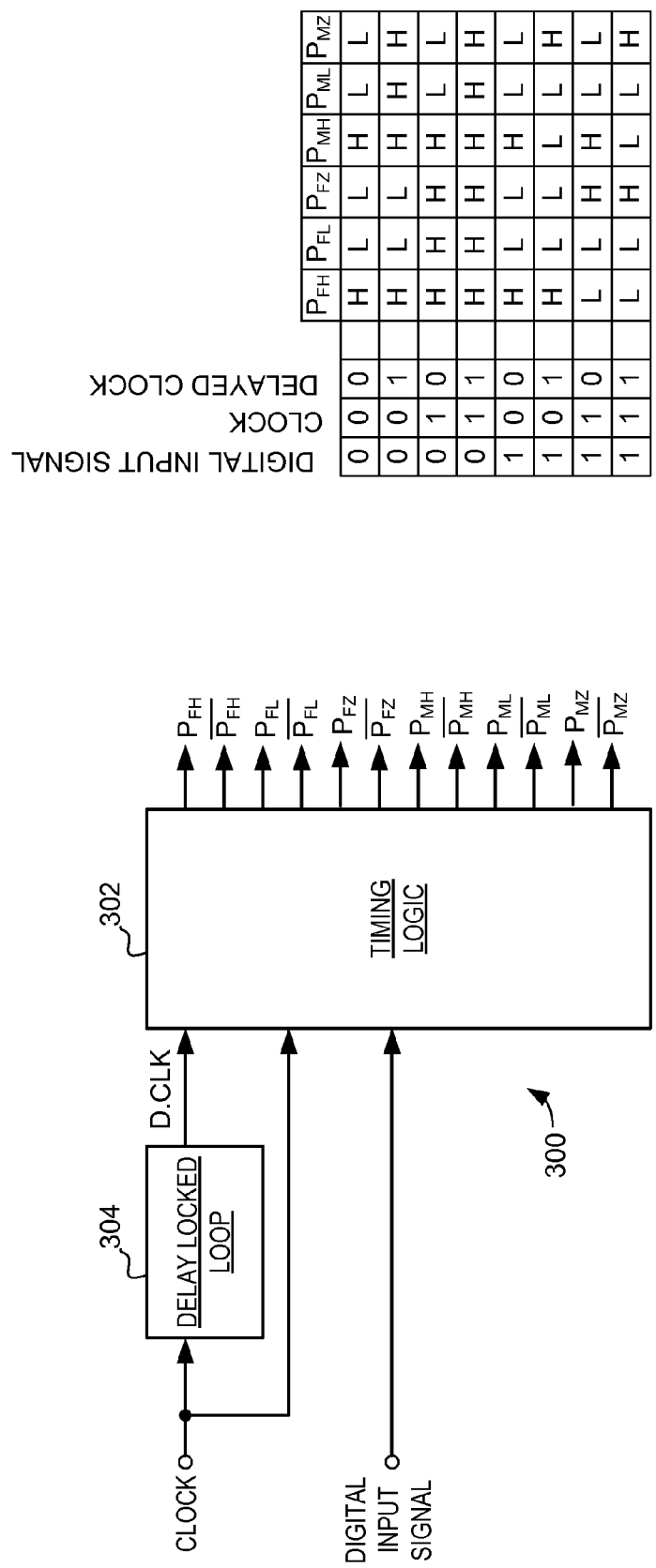
FIG. 3A is a schematic diagram of a control signal generator in accordance with an exemplary embodiment.
FIG. 3B is a chart of a logic relationship for the control signal generator in accordance with an exemplary embodiment.

Turning now to FIG. 3A, a control signal generator 300 is illustrated schematically. In general, the control signal generator 300 is an example of the type of device that can be used to provide control signals for a digital-to-analog converter (e.g., DAC element 200) in accordance with the embodiments described herein. In the illustrated embodiment, the control signal generator 300 includes timing logic 302 and a delay locked loop 304. A clock signal is applied to both the timing logic 302 and the delay locked loop 304, and a digital input signal is applied to the timing logic 302. The delay locked loop 304 generates a delayed clock signal from the clock signal. This delay between the delayed clock signal and the original clock signal corresponds to the delay between the first RZ pulses and the second RZ pulses generated by the switching elements (e.g., switching elements 102 and 104, 202 and 204). As such, the delay locked loop 304 would typically be configured to provide a non-zero delay of less than T/2, where T is the period of the clock signal. For example, delays of T/6 and T/4 can be provided in some embodiments. It should be noted that the delay locked loop 304 is only one example of the type of device that can be used to create a delayed clock signal.

The timing logic 302 is configured to receive the clock signal, the delayed clock signal, and the digital input signal, and generate control signals for the DAC. In the illustrated embodiment, the timing logic 302 generates control signals $P_{FH}$, $P_{FL}$, $P_{FZ}$, $P_{MH}$, $P_{ML}$, $P_{MZ}$, and their inverses. These control signals are configured to control the transistors of switching elements (e.g., switching elements 202 and 204), such that first RZ pulses and second RZ pulses are generated. Turning now to FIG. 3B, a chart 350 illustrates an exemplary logic relationship for generating such control signals. Specifically, the chart 350 illustrates how control signals $P_{FH}$, $P_{FL}$, $P_{FZ}$, $P_{MH}$, $P_{ML}$, $P_{MZ}$, and their inverses are either driven high (H) or low (L) as determined by the logic states (represented as 1 or 0) of the of the digital input signal, clock signal, and delayed clock signal. For example, when the digital input signal, clock and delayed clock are all "1", the control signals $P_{FH}$, $P_{FL}$, $P_{MH}$ and $P_{ML}$ are all driven high, while $P_{FZ}$ and $P_{MZ}$ are driven low. It should be noted that the logic relationship illustrated in chart 350 is particularly applicable to the DAC element 200 of FIG. 2, and that this is just one example and that different implementations of the DAC will typically require different logic relationships for generating control signals.

Turning now to FIG. 4, a timing diagram 400 illustrates the exemplary operation of the DAC element 200 using the control signal generator 300 and the logic illustrated in chart 350. Specifically, the timing diagram 400 illustrates exemplary waveforms for a digital input signal, clock and delayed clock. Additionally, the timing diagram 400 illustrates exemplary waveforms for the generated control signals $P_{FH}$, $P_{FL}$, $P_{FZ}$, $P_{MH}$, $P_{ML}$, and $P_{MZ}$. The timing diagram 400 further illustrates exemplary resulting waveforms for first RZ pulses and second (delayed) RZ pulses that would be generated using such control signals. Finally, the timing diagram 400 illustrates exemplary waveforms for the combined output of the DAC element 200.

In timing diagram 400, the digital input waveform shows an exemplary sequence of "010110", where digital input signal sequence values are determined at the rising edges of the clock signals. In this illustrated embodiment the delayed clock has a delay of T/4 compared to the original clock signal, where T is again the period of the clock and the delayed clock signals. The control signals $P_{FH}$, $P_{FL}$, $P_{FZ}$, $P_{MH}$, $P_{ML}$, and $P_{MZ}$ illustrated in timing diagram 400 are generated in response to the values of the digital input signals, the clock, and the delayed clock, according to the logic illustrated chart 350. With the control signals and their inverses applied to the DAC element 200, the result is a first RZ pulse waveform and a second delayed RZ pulse waveform. Again, in this example the second delayed RZ pulse waveform has a delay of T/4 compared to the first RZ pulse waveform, but this is only one example, and other delays could instead be used. Finally, the out waveform in the timing diagram 400 shows the result of combining the first RZ pulse waveform and the second RZ pulse waveform. Specifically, the timing diagram 400 shows the stepped RZ pulse scheme provided to the output by summing the first RZ pulse waveform and the second RZ pulse waveform. As can be seen in the illustrated output waveform, the resulting output of the DAC element 200 is proportional to the digital input signal, and the DAC element 200 can thus be used as an analog representation of such digital input waveforms.

For example, at time T1 the input data signal rises to a value of "1", and at the same time the clock also rises to "1" while the delayed clock stays at "0". This causes the first RZ pulse waveform to rise to +5 mA, but the second RZ pulse waveform remains at 0 mA. Thus, the combined output at time T1 is +5 mA. Then, at time T2 the delayed clock also rises to "1". This causes the second RZ pulse waveform to also rise to +5 mA. Thus, at time T2 the combined output is +10 mA. Finally at time T3, the clock signal drops to "0". This causes the first RZ pulse waveform to drop to 0 mA, while the second RZ pulse waveform remains at +5 mA. Thus, at time T3 the combined output returns +5 mA.

As can be seen in this example the data input signal rising to a value of "1" causes the combined output to rise in 5 mA steps to a final value of +10 mA, and then drop in 5 mA steps. Similar but opposite actions occur at times T4, T5, and T6, with the combined output dropping in −5 mA steps to a value of −10 mA in response to the data input signal dropping to a value of "0".

As was noted above, the use of such DACs (e.g., DAC elements 100 and 200) and a stepped RZ pulse scheme can provide both relatively good immunity to clock jitter and relatively good immunity to inter-symbol interference, while still satisfying relatively low slew rate requirements.

Inter-symbol interference is generally the distortion of a signal in which a previous symbol interferes with subsequent symbols. In such situations, the previous symbol has a similar effect as noise, and thus can reduce the signal-to-noise ratio (SNR) of the system. In traditional NRZ DACs the initial level of each NRZ pulse depends on the previous state, and thus such systems are relatively susceptible to inter-symbol interference. Using a stepped RZ pulse scheme, where the output of the DAC is the superposition of multiple time-offset RZ pulses, can provide greater immunity to inter-symbol interference compared to traditional DACs that use NRZ pulses. Specifically, the stepped RZ pulse scheme shares the same immunity to inter-symbol interference as a traditional RZ pulse scheme because each stepped RZ pulse starts from the same initial level.

Clock jitter is generally the deviation of a clock signal from true periodicity. Such deviation occurs at each clock edge, and the effects of such deviations for each clock edge can accumulate over a period. Traditional RZ DACs are relatively susceptible to errors caused by clock jitter because thereABC are two edges of the RZ pulse that are affected by the clock jitter for each clock period. Using a stepped RZ pulse scheme, where the output of the DAC is the superposition of multiple time-offset RZ pulses, can provide greater immunity to the effects of clock jitter compared to traditional DACs that use RZ pulses. Specifically, in the stepped RZ pulse scheme the error resulting from clock jitter is reduced by the square root of the number of time-offset pulses in the combined pulse compared to traditional DACs that use RZ pulses. This reduction in error is provided because the error power contributed by each time-offset pulse is proportional to the square of the difference between consecutive time-offset pulse amplitudes and to the variance of the clock jitter. Thus, the square root of the sum of these error power contributions yields a resultant error due to clock jitter that is proportional to:

$$\frac{S\sigma}{\sqrt{N}}$$

where N is the number of time-offset RZ pulses in the combined pulse, S is the traditional RZ output level, and $\sigma$ is the standard deviation of the clock jitter. As can be seen in the above equation, the resultant error due to clock jitter is reduced for every additional time-offset pulse that is added into the combined pulse output. And in any case, this error induced by clock jitter is reduced compared to a traditional RZ pulse scheme where such error is instead simply proportional to S and $\sigma$.

The slew rate of a system is the maximum rate of change of an output per unit time. Exceeding the slew rate of a system can cause non-linearites and other distortions. Traditional RZ DACs are sensitive to slew rate limitations because the output of the RZ DAC can be driven from (or return to) the zero state to either extreme in response to one clock edge.

In contrast, the use of the DAC described above (e.g., DAC elements 100 and 200) and a stepped RZ pulse scheme can reduce the maximum slew rate required. Specifically, because the stepped RZ pulse scheme generated by DAC rises and falls in relatively smaller steps, the slew rate requirements are relaxed. In the example of FIG. 4, the combined output of the DAC rises +5 mA at time T1, then rises a second +5 mA at time T2. Likewise, the combined output of the DAC falls −5 mA at time T4, then falls a second −5 mA at time T5. In contrast, a traditional DAC with a traditional RZ output could rise the entire +10 mA in one transition and fall the entire −10 mA in another transition. Thus, in both cases the stepped pattern of the output waveform has reduced slew rate requirements compared to a traditional RZ pulse scheme. This reduced slew rate requirement provided by the stepped RZ pulse scheme can provide improved linearity at higher frequencies.

Thus, DACs provided in accordance with the embodiments described herein and the use of a stepped RZ pulse scheme can provide improved immunity to inter-symbol interference compared to traditional NRZ DACs, while also providing both improved immunity to clock jitter and relaxed slew rate requirements compared to traditional RZ DACs. Thus, the embodiments described herein can provide a combination of performance features not found in any one traditional DAC.

It should be further noted that while the first RZ pulses, second RZ pulses, and combined output pulses are generated and illustrated in FIG. 4 in terms of current (i.e., mA), such pulses could instead be generated and expressed in terms of voltage or charge. In any case, the combined output can provide an analog representation of the digital input signals.

The DACs described above can be used in a variety of applications. In one specific application, the DACs described above can be utilized in the feedback path of an ADC. More specifically, the DACs can be utilized in a continuous-time sigma-delta ADC implemented with continuous-time sigma-delta modulation.

Figure 5:
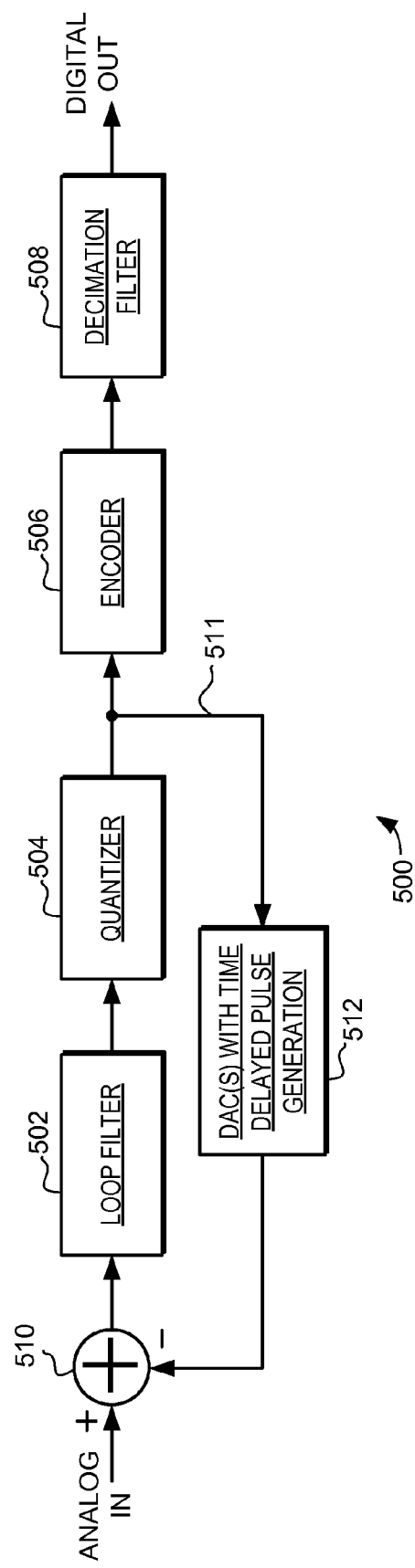
FIG. 5 is a schematic diagram of an ADC in accordance with an exemplary embodiment.

Turning now to FIG. 5, an exemplary ADC 500 is illustrated schematically. The ADC 500 includes a loop filter 502, a quantizer 504, an encoder 506, a decimation filter 508, a summing stage 510, and a feedback path 511 that includes one or more DAC elements 512, with the one or more DAC elements 512 configured to utilize time delayed pulse generation.

In general, the summing stage 510 is configured to subtract a feedback signal from an input signal. During operation of the ADC 500 the input signal and feedback signal are applied to the summing stage 510. In response, the summing stage 510 outputs a difference signal that corresponds to the difference between the analog input signal and the analog feedback signal. Because of the feedback operation of the ADC 500 this difference signal closely approximates the quantization noise in the analog feedback signal.

The output of the summing stage 510 is coupled to the loop filter 502. In general, the loop filter 502 integrates and filters the difference signal received from the summing stage 510. In doing so, the loop filter 502 shapes the quantization noise and produces a filtered analog signal. It should be noted that a variety of different topologies could be used in the arrangement of the summing stage 510 and loop filter 502, including lowpass topology, bandpass topology, a feedback topology, a feedforward topology, a feedforward-feedback topology or another hybrid topology, a cascade topology, a quadrature or complex topology, and the like. Additionally, the loop filter 502 can be implemented using active circuitry components, passive circuitry components, or a suitable combination thereof.

The filtered signal is applied as an input signal to the quantizer 504. The quantizer 504 is configured to generate a quantized signal at the quantizer output that comprises one or more bits which are representative of the filtered analog signal. The quantizer 504 generates the quantized signal at by sampling the filtered analog signal at the quantizer input with a particular sampling frequency ($f_s$). For example, a quantizer 504 used in continuous-time sigma-delta modulation may have a sampling frequency ranging from the tens of megahertz (MHz) to hundreds of MHz. It should be noted however that the sampling frequency of the quantizer 504 will typically vary depending on the needs of a particular application (e.g., the desired effective number of bits). As some example implementations, the quantizer 504 may utilize a flash analog-to-digital conversion architecture or another suitable conversion architecture.

The output of the quantizer 504 is applied to the encoder 506, which produces digital values. The digital values are applied to a decimation filter 508. The decimation filter 508 down samples the digital values to produce the digital output of the ADC 500.

The quantized output of the quantizer 504 is also fed back along the feedback path 511 to the DAC element 512. The DAC element 512 converts the quantized output of the quantizer 504 to analog, thus generating the analog feedback signal that is fed back to the summing stage 510. In accordance with the embodiments described herein, the DAC element 512 comprises first and second switching elements (e.g., switching elements 102, 104, 202, 204) that are configured to generate time offset RZ pulses. Thus, the DAC element 512 is configured to generate the analog feedback signal to have a stepped RZ pulse scheme, where the analog feedback signal is the superposition of multiple time-offset RZ pulses. As will be discussed in greater detail below, the use of such a DAC element 512 in the ADC 500 can provide both relatively good immunity to clock jitter and relatively good immunity to inter-symbol interference, while still providing relatively low slew rate requirements.

It should be understood that FIG. 5 is a simplified diagram of the ADC 500. For example, while the ADC 500 is depicted in a single-ended form, in many embodiments the ADC 500 may be implemented in a differential manner (e.g., as a differential circuit adapted to utilize differential signals). Furthermore, the ADC 500 can be implemented to include additional or alternative components, and can be implemented with different topologies, including different feed-forward sigma-delta topologies.

Furthermore, the ADC 500 can be configured for either single-bit operation or multi-bit operation, depending on the particular needs of a given application. In a single-bit application the quantizer 504 would typically be a single-bit quantizer that generates a single-bit digital output. That single-bit output would be used generate the output of the ADC 500, and would also be fed back to the DAC element 512 to generate an analog feedback signal.

In contrast, in a multi-bit application the quantizer 504 would typically be a multi-bit quantizer configured to quantize an analog signal into a multi-bit digital output. In such an embodiment, the multi-bit digital output of the quantizer would be used to generate the digital output of the ADC 500 and fed back along the feedback path 511. Specifically, in such an embodiment, the multi-bit digital output could be fed back along multiple feedback paths 511 to corresponding multiple DAC elements 512. For example, the multi-bit digital output could be fed back in a thermometer code format, with a separate feedback path 511 and DAC element 512 for each unit in the thermometer code format. In such an embodiment, the outputs for each of the multiple DAC elements 512 would then be coupled together to provide a single analog feedback signal to the summing stage 510. For example, multiple DAC elements 512 can be implemented together as a single integrated DAC device. Such an integrated DAC device may have a thermometer-encoded input, and various elements desired to dynamically match the individual DAC elements 512 to improve the overall linearity of the integrated DAC device.

For example, in an ADC 500 where the quantizer 504 comprises a "4-bit" quantizer, the quantizer 504 can output a thermometer-encoded output with 15 digital signals that represent 16 possible states. These 15 digital signals can be fed back with 15 separate feedback paths 511 to an integrated DAC device that includes 15 DAC elements 512, with one DAC element 512 for each of the 15 units in a thermometer code representation of the 4-bits. And again, in such an embodiment, the outputs for each of the DAC elements 512 can be coupled together to provide a single analog feedback signal to the summing stage 510. And such an example can be expanded to larger systems that are implemented with greater numbers of feedback paths 511 and DAC elements 512.

The use of such a DAC element 512 in the ADC 500 can again provide both relatively good immunity to clock jitter and relatively good immunity to inter-symbol interference, while still satisfying relatively low slew rate requirements.

In ADCs inter-symbol interference can result in variations in the total charge provided in the analog feedback signal, and can cause errors at the output. Traditional ADCs that use such NRZ DACs are more sensitive to inter-symbol interference, and thus more likely to have SNR limitations caused by inter-symbol interference. Specifically, because NRZ pulses can start from different initial levels there can be variations in the total charge provided in the analog feedback signal for each NRZ pulse. In contrast, using DAC element 512 and a stepped RZ pulse scheme can provide the ADC 500 with increased immunity to inter-symbol interference and increased SNR because each stepped RZ pulse starts from the same initial level.

In ADCs clock jitter can also result in errors at the output. Traditional ADCs that use RZ DACs are relatively susceptible to errors caused by clock jitter because there are two edges of the RZ pulse that are affected by the clock jitter for each clock period. In contrast, using DAC element 512 and a stepped RZ pulse scheme can provide increased immunity to clock jitter because the error resulting from clock jitter is reduced by the square root of the number of time-offset pulses in the combined pulse compared to traditional DACs that use RZ pulses.

With regard to slew rate requirements, in ADCs such slew rate limitations can negatively impact the SNR at higher frequencies. Traditional ADCs that use such RZ DACs are more sensitive to slew rate limitations because the output of the RZ DAC can be driven from one extreme value to another in response one clock edge. For example, the output of an RZ DAC can exceed the slew rate of amplifiers in the loop filter 502 when transitioning from one extreme value to another in one transition. In contrast, using DAC element 512 in ADC 500 can reduce the maximum slew rate required in the loop filter 502. Specifically, because the stepped RZ pulse signal generated by DAC element 512 rises and falls in relatively smaller steps, the ADC 500 has reduced slew rate requirements for the loop filter 502 and thus can have increased SNR at higher frequencies.

Thus, the use of DAC element 512 in the ADC 500 can provide both improved immunity to inter-symbol interference compared to traditional NRZ DACs, and can provide improved immunity to clock jitter and relaxed slew rate requirements compared to traditional RZ DACs. Thus, the embodiments described herein can provide a combination of performance features to the ADC 500 not found in any one traditional DAC.

In one embodiment, a digital-to-analog converter (DAC) is provided, the DAC comprising: an input configured to receive at least one control signal; a first switching element, the first switching element configured to generate a first return-to-zero pulse in response to the at least one control signal; a second switching element, the second switching element configured to generate a second return-to-zero pulse in response to the at least one control signal, the second return-to-zero pulse delayed in time from and partially overlapping with the first return-to-zero pulse; and an output, the output coupled to the first switching element and the second switching element, the output configured to combine the first return-to-zero pulse and the second return-to-zero pulse to generate a combined pulse proportional to a digital input signal.

In another embodiment, an analog-to-digital converter (ADC) is provided, the ADC comprising: a summing stage configured to receive an analog input signal and an analog feedback signal, and further configured to output a difference signal; a filter coupled to the summing stage to receive the difference signal, the filter configured to filter the difference signal and output a filtered signal; a quantizer coupled to the filter to receive the filtered signal, the quantizer configured to quantize the filtered signal and output a quantized signal; a digital-to-analog converter (DAC), the DAC including at least a first DAC element connected to the quantizer to receive at least a first bit of the quantized signal, the first DAC element comprising: a first switching element, the first switching element configured to generate a first return-to-zero pulse in response to the first bit of the quantized signal; a second switching element, the second switching element configured to generate a second return-to-zero pulse in response to the first bit of the quantized signal, the second return-to-zero pulse delayed in time from and partially overlapping with the first return-to-zero pulse; an output, the output coupled to the first switching element and the second switching element, the output configured to combine the first return-to-zero pulse and the second return-to-zero pulse to generate a combined pulse proportional to the first bit of the quantized signal, the output coupled to the summing stage to feedback the combined pulse to the summing stage as at least part of the analog feedback signal; a current source, the current source configured to provide a supply current and split the supply current to provide substantially equal current to the first switching element and the second switching element; and a current sink, the current sink configured to sink the supply current from the first switching element and the second switching element.

In another embodiment, a method of converting a digital input signal to an analog output signal is provided, the method comprising: generating a first return-to-zero pulse in response to at least one control signal; generating a second return-to-zero pulse in response to the at least one control signal, the second return-to-zero pulse delayed in time from and partially overlapping with the first return-to-zero pulse; and combining the first return-to-zero pulse and the second return-to-zero pulse to generate a combined pulse proportional to the digital input signal.

For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the foregoing description for the purpose of reference only, and thus are not intended to be limiting.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A digital-to-analog converter (DAC) comprising:
an input configured to receive at least one control signal;
a first switching element, the first switching element configured to generate a first return-to-zero pulse in response to the at least one control signal;
a second switching element, the second switching element configured to generate a second return-to-zero pulse in response to the at least one control signal, the second return-to-zero pulse delayed in time from and partially overlapping with the first return-to-zero pulse; and
an output, the output coupled to the first switching element and the second switching element, the output configured to combine the first return-to-zero pulse and the second return-to-zero pulse to generate a combined pulse proportional to a digital input signal.

2. The DAC of claim 1 further comprising
a current source, the current source configured to provide a supply current and split the supply current to provide substantially equal current to the first switching element and the second switching element; and
a current sink, the current sink configured to sink the supply current from the first switching element and the second switching element.

3. The DAC of claim 1 wherein a clock signal having a period T is used to generate the at least one control signal, and wherein the second return-to-zero pulse is offset in time from the first return-to-zero-pulse between T/8 and 3T/8.

4. The DAC of claim 1 further comprising:
a third switching element, the third switching element configured to generate a third return-to-zero pulse in response to the at least one control signal, the third return-to-zero pulse delayed in time from and partially overlapping with both the first return-to-zero pulse and the second return-to-zero pulse; and wherein the output is further coupled to the third switching element and further configured to combine the third return-to-zero pulse with the first return-to-zero pulse and the second return-to-zero pulse to generate the combined pulse proportional to the digital input signal.

5. The DAC of claim 4 further comprising:
a fourth switching element, the fourth switching element configured to generate a fourth return-to-zero pulse in response to the at least one control signal, the fourth return-to-zero pulse delayed in time from and partially overlapping with the first return-to-zero pulse, the second return-to-zero pulse, and the third return-to-zero pulse; and wherein the output is further coupled to the fourth switching element and further configured to combine the fourth return-to-zero pulse with the first return-to-zero pulse, the second return-to-zero pulse, and the third return-to-zero pulse to generate the combined pulse proportional to the digital input signal.

6. The DAC of claim 1 further comprising a control signal generator, the control signal generator configured to receive a clock signal and the digital input signal and generate the at least one control signal responsive to the clock signal and the digital input signal.

7. The DAC of claim 6 wherein the control signal generator includes a delay locked loop, the delay locked loop configured to receive the clock signal and generate a delayed clock signal.

8. The DAC of claim 1 wherein the combined pulse is proportional to the digital input signal such that when the combined pulse is integrated over time, the combined and integrated pulse provides an analog representation of the digital input signal.

9. An analog-to-digital converter (ADC) comprising:
a summing stage configured to receive an analog input signal and an analog feedback signal, and further configured to output a difference signal;
a filter coupled to the summing stage to receive the difference signal, the filter configured to filter the difference signal and output a filtered signal;
a quantizer coupled to the filter to receive the filtered signal, the quantizer configured to quantize the filtered signal and output a quantized signal; and
a digital-to-analog converter (DAC), the DAC including at least a first DAC element connected to the quantizer to receive at least a first bit of the quantized signal, the first DAC element comprising:
 a first switching element, the first switching element configured to generate a first return-to-zero pulse in response to the first bit of the quantized signal;
 a second switching element, the second switching element configured to generate a second return-to-zero pulse in response to the first bit of the quantized signal, the second return-to-zero pulse delayed in time from and partially overlapping with the first return-to-zero pulse;
 an output, the output coupled to the first switching element and the second switching element, the output configured to combine the first return-to-zero pulse and the second return-to-zero pulse to generate a combined pulse proportional to the first bit of the quantized signal, the output coupled to the summing stage to feedback the combined pulse to the summing stage as at least part of the analog feedback signal;
 a current source, the current source configured to provide a supply current and split the supply current to provide substantially equal current to the first switching element and the second switching element; and
 a current sink, the current sink configured to sink the supply current from the first switching element and the second switching element.

10. The ADC of claim 9 wherein the first DAC element further comprises:
a third switching element, the third switching element configured to generate a third return-to-zero pulse in response to the first bit of the quantized signal, the third return-to-zero pulse delayed in time from and partially overlapping with both the first return-to-zero pulse and the second return-to-zero pulse; and wherein the output is further coupled to the third switching element and further configured to combine the third return-to-zero pulse with the first return-to-zero pulse and the second return-to-zero pulse to generate the combined pulse proportional to the first bit of the quantized signal.

11. The ADC of claim 10 wherein the first DAC element further comprises:
a fourth switching element, the fourth switching element configured to generate a fourth return-to-zero pulse in response to the at least one control signal, the fourth return-to-zero pulse delayed in time from and partially overlapping with the first return-to-zero pulse, the second return-to-zero pulse, and the third return-to-zero pulse; and wherein the output is further coupled to the fourth switching element and further configured to combine the fourth return-to-zero pulse with the first return-to-zero pulse, the second return-to-zero pulse, and the third return-to-zero pulse to generate the combined pulse proportional to the first bit of the quantized signal.

12. The ADC of claim 9 wherein the DAC further comprises a control signal generator, the control signal generator configured to receive the quantized signal and a clock signal, the control signal generator further configured to generate a plurality of control signals responsive to the quantized signal and the clock signal, and where the first switching element and the second switch element are configured to receive the plurality of control signals from the control signal generator.

13. The ADC of claim 12 wherein the control signal generator includes a delay locked loop, the delay locked loop configured to receive the clock signal and generate a delayed clock signal.

14. The ADC of claim 12 wherein the clock signal has a period T, and wherein the second return-to-zero pulse is offset in time from the first return-to-zero-pulse between T/8 and 3T/8.

15. The ADC of claim 9 wherein the DAC further comprises a second DAC element, the second DAC element coupled to the quantizer to receive a second bit of the quantized signal, the second DAC element comprising:
a third switching element, the third switching element configured to generate a third return-to-zero pulse in response to the second bit of the quantized signal;
a fourth switching element, the fourth switching element configured to generate a fourth return-to-zero pulse in response to the second bit of the quantized signal, the fourth return-to-zero pulse delayed in time from and partially overlapping with the third return-to-zero pulse; and
a second output, the second output coupled to the third switching element and the fourth switching element, the second output configured to combine the third return-to-zero pulse and the fourth return-to-zero pulse to generate a second combined pulse proportional to the second bit of the quantized signal, the second output coupled to the summing stage to feedback the second combined pulse to the summing stage.

16. The ADC of claim 9 wherein the ADC is configured to use continuous-time sigma-delta modulation.

17. A method of converting a digital input signal to an analog output signal, comprising:
   generating a first return-to-zero pulse in response to at least one control signal;
   generating a second return-to-zero pulse in response to the at least one control signal, the second return-to-zero pulse delayed in time from and partially overlapping with the first return-to-zero pulse; and
   combining the first return-to-zero pulse and the second return-to-zero pulse to generate a combined pulse proportional to the digital input signal.

18. The method of claim 17 wherein the step of generating the first return-to-zero pulse comprises using a first a clock signal having a period T, and wherein the second return-to-zero pulse is offset in time from the first return-to-zero-pulse between T/8 and 3T/8.

19. The method of claim 17 further comprising:
   generating a third return-to-zero pulse in response to the at least one control signal, the third return-to-zero pulse delayed in time from and partially overlapping with both the first return-to-zero pulse and the second return-to-zero pulse; and
   combining the third return-to-zero pulse with the first return-to-zero pulse and the second return-to-zero pulse to generate the combined pulse proportional to the digital input signal.

20. The method of claim 17 further comprising generating the at least one control signal responsive to a clock signal, a delayed clock signal, and the digital input signal.

* * * * *